United States Patent [19]
Goto

[11] Patent Number: 5,306,936
[45] Date of Patent: Apr. 26, 1994

[54] NON-VOLATILE SEMICONDUCTOR MEMORY DEVICE HAVING OXYNITRIDE FILM FOR PREVENTING CHARGE IN FLOATING GATE FROM LOSS

[75] Inventor: Yoshiro Goto, Tokyo, Japan
[73] Assignee: Nec Corporation, Tokyo, Japan
[21] Appl. No.: 102,269
[22] Filed: Aug. 5, 1993
[30] Foreign Application Priority Data
  Aug. 5, 1992 [JP] Japan .................. 4-208677
[51] Int. Cl.$^5$ .................. H01L 29/68; H01L 29/78; H01L 29/34
[52] U.S. Cl. .................. 257/324; 257/316; 257/634; 257/639; 257/640; 257/641; 257/644; 257/649; 257/650
[58] Field of Search .............. 257/324, 325, 315, 316, 257/634, 639, 640, 641, 644, 649, 650

[56] References Cited
U.S. PATENT DOCUMENTS
5,040,036 8/1991 Hazani .................. 257/324
5,057,886 10/1991 Riemenschneider et al. ...... 257/324

OTHER PUBLICATIONS
A Submicron CMOS Two Level Metal Process with Planarization Techniques, U. Fritsch et al, Microelectronic Technology Center, Otto-Hahn-Ring 6, 8000 Munchen 83, West Germany, June. 13-14, 1988, pp. 69-75.

Primary Examiner—Ngan Ngo
Attorney, Agent, or Firm—Sughrue, Mion, Zinn, Macpeak & Seas

[57] ABSTRACT

An electrically programmable read only memory device store data bits in the form of electric charges accumulated in floating gate electrodes of the memory cells, and a spin-on glass film is incorporated in an inter-level insulating film structure over the memory cells so as to create a smooth surface for wirings, wherein a silicon oxynitride film is inserted between the floating gate electrodes and the spin-on-glass film for preventing the accumulated electric charges from undesirable ion-containing water diffused from the spin-on-glass film.

7 Claims, 10 Drawing Sheets

NON-VOLATILE SEMICONDUCTOR MEMORY DEVICE HAVING OXYNITRIDE FILM FOR PREVENTING CHARGE IN FLOATING GATE FROM LOSS

FIELD OF THE INVENTION

This invention relates to a non-voltage semiconductor memory device and, more particularly, to a multiple inter-level insulating film structure incorporated in, for example, a floating gate type non-volatile semiconductor memory device.

DESCRIPTION OF THE RELATED ART

Various non-volatile semiconductor memory devices for storing data bits in the form of accumulated electric charge have been proposed, and are categorized into an electrically programmable read only memory device erasable with ultra-violet radiation, an ordinary electrically erasable and programmable read only memory device and a flush-write electrically erasable and programmable read only memory device erasable with lower voltage level than the ordinary electrically erasable and programmable read only memory device. These non-volatile semiconductor memory device are different in erasing technique. However, even though the category is different, electric charge is selectively accumulated in the memory cells, and, accordingly, a data bit is stored in the accumulated electric charge. For this reason, the electron retaining capability directly affects reliability of the memory cell, and it is important for the non-volatile semiconductor memory device to improve the electron retaining capability.

Description is firstly made on the structure of a typical example of the electrically programmable read only memory device through a process sequence with reference to FIGS. 1A to 1G.

Figure 1A:
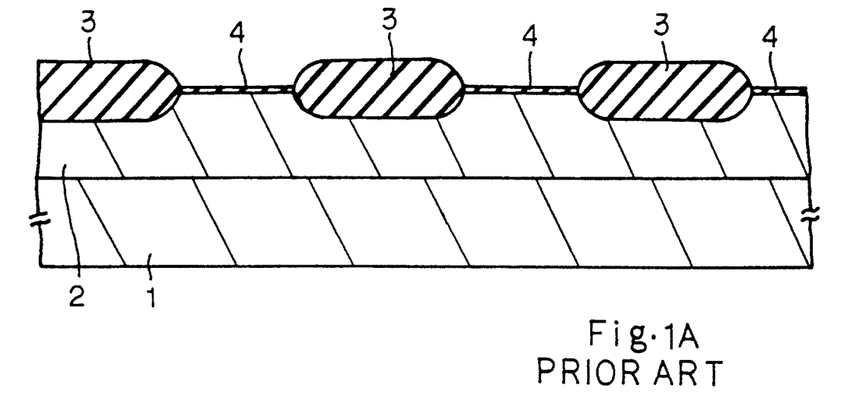
FIGS. 1A to 1G are cross sectional views showing the process sequence for fabricating the prior art electrically programmable read only memory device.

Referring first to FIG. 1A, the prior art process sequence starts with preparation of a p-type silicon substrate 1, and a p-type well 2 is defined in the p-type silicon substrate 1 for changing the resistivity. Subsequently, a thick field oxide film 3 is selectively grown through a localized oxidation of silicon process, by way of example, and defines active areas in the major surface for circuit elements. Silicon oxide films are removed from the active areas, and first gate insulating oxide films 4 are thermally grown on the fresh major surface.

Figure 1B:
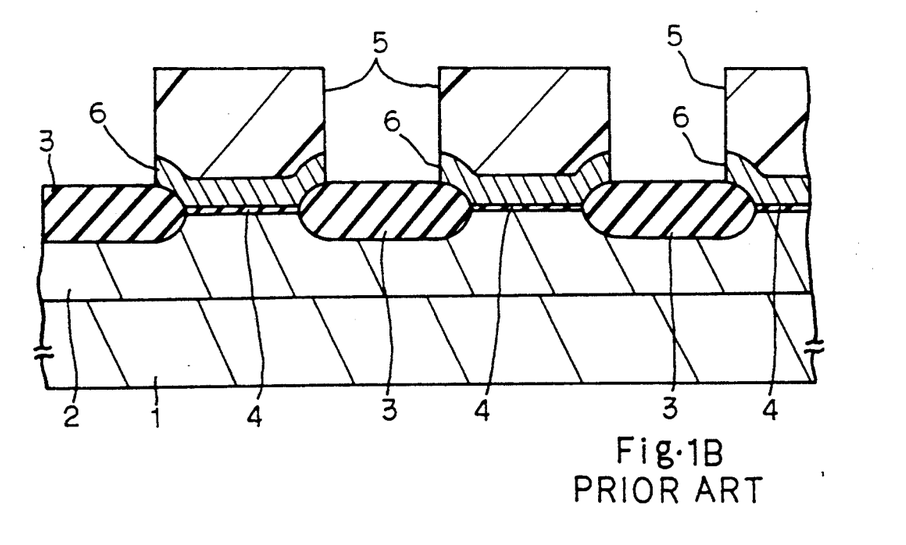

A polysilicon film is deposited over the entire surface of the structure shown in FIG. 1A, and photoresist solution is spread on the polysilicon film for covering the polysilicon film with the photoresist film. The photoresist film is exposed to light through an appropriate mask, and is developed into a photoresist mask 5. Using the photoresist mask 5, the polysilicon film is partially etched away, and polysilicon strips 6 are left on the first gate oxide films 4, respectively. The polysilicon strips 6 are spaced apart from one another at intervals, and extend in the direction perpendicular to the paper where FIG. 1B is illustrated.

The photoresist mask 5 is stripped off, and the polysilicon strips 6 are subjected to a thermal oxidation. Then, silicon oxide is grown on the polysilicon strips 6, and silicon oxide films cover the polysilicon strips 6, respectively. Polysilicon is deposited over the entire surface of the structure again, and the silicon oxide films and the exposed field oxide film 3 are covered with a polysilicon film.

Figure 1C:
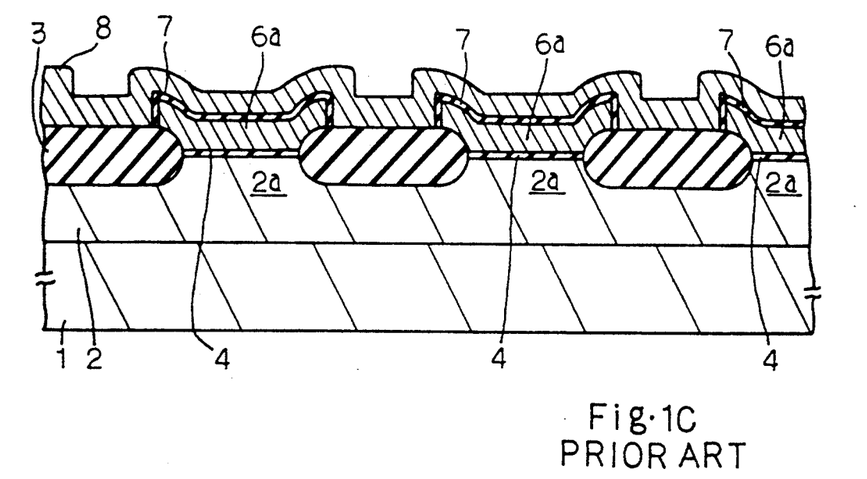

Though not shown in the drawings, an appropriate photoresist mask is produced from a photoresist film through a lithographic process, and defines the configuration of control gate electrodes. Using the appropriate photoresist mask, the polysilicon film, the silicon oxide films and the polysilicon strips 6 are sequentially etched away, and floating gate electrodes 6a, second gate oxide films 7 and control gate electrode 8 are patterned in a self-aligned manner as shown in FIG. 1C. FIG. 1C shows only one control gate electrode 8, and the control gate electrode 8 is shared between the floating gate electrodes 6a. The first gate oxide film 4, the floating gate electrode 6a, the second gate oxide film 7 and the control gate electrode 8 form in combination a multiple level gate structure.

Using the multiple gate structures as a mask, donor impurity is ion implanted into the p-type well 2, and source and drain regions are formed in the p-type well on both sides of a channel region 2a beneath each multiple gate structure. Since the source and drain regions are spaced in the direction perpendicular to the paper, they are not shown in the drawings.

Figure 1D:
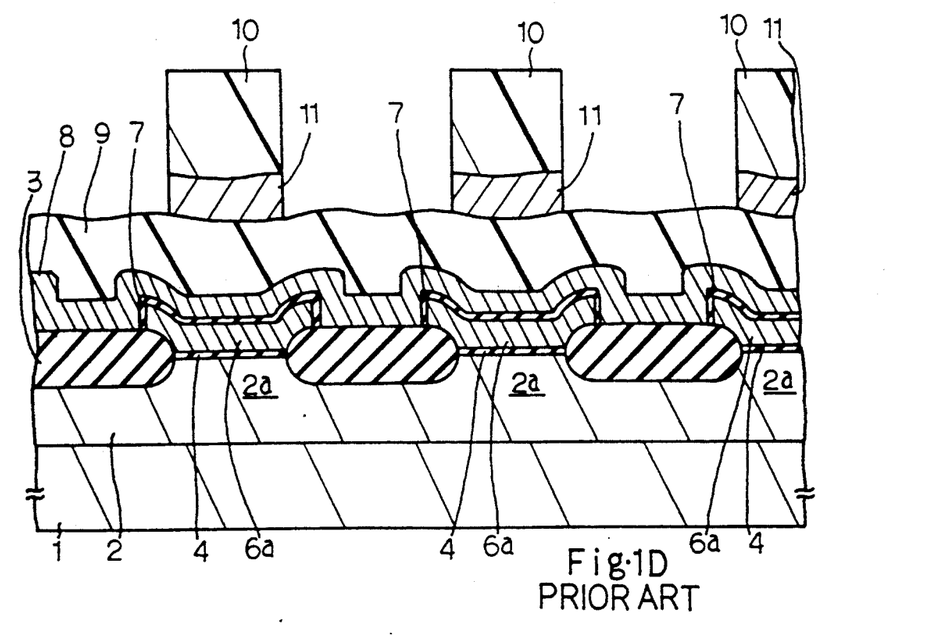

Phosphosilicate glass is deposited over the entire surface of the structure, and a phosphosilicate glass film 9 covers the multiple gate structures and the exposed field oxide film 3. On the phosphosilicate glass film 9 is deposited appropriate metal which passes through contact holes previously formed in the phosphosilicate glass film 9. An appropriate photoresist mask 10 is patterned from a photoresist film through the lithographic process, and the metal film is partially etched away for forming lower metal wirings 11 as shown in FIG. 1D.

Figure 1E:
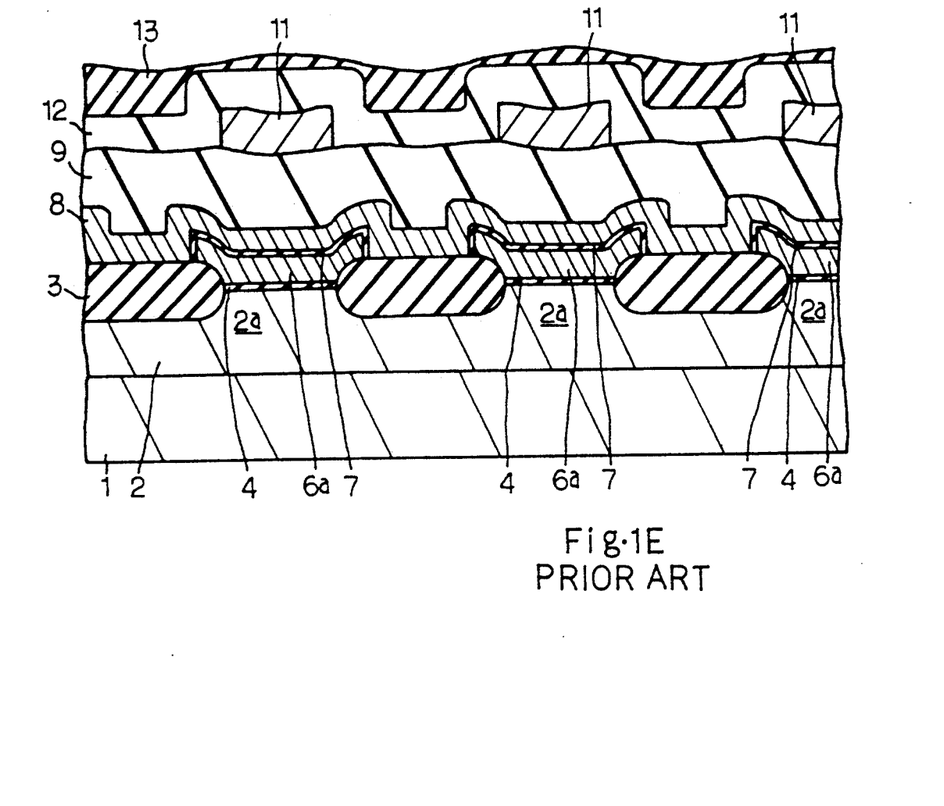

The photoresist mask is stripped off, and silicon oxide is deposited over the entire surface of the structure through a plasma-assisted chemical vapor deposition process. The plasma-deposited silicon oxide film 12 topographically covers the lower metal wirings 11. Alcohol solution containing silicon oxide is spun onto the plasma-deposited silicon oxide film 12, and a spin-on-glass film 13 is formed thereon. The resultant structure is illustrated in FIG. 1E.

Figure 1F:
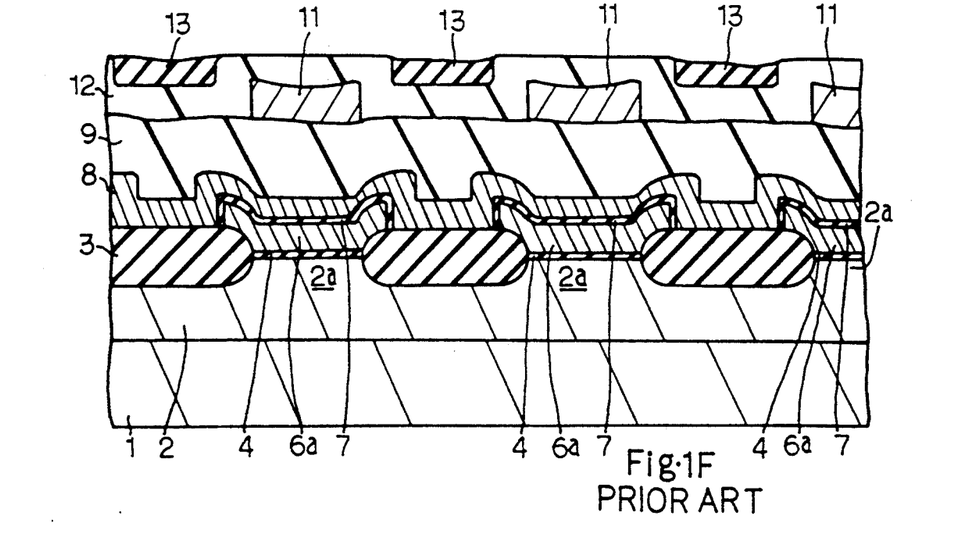

The spin-on-glass film 13 and the plasma-deposited silicon oxide film 12 are uniformly etched without any mask, and spin-on-glass is left in the valleys in the plasma-deposited silicon oxide film 12. Thus, a smooth top surface is created through the etch-back process as shown in FIG. 1F.

Figure 1G:
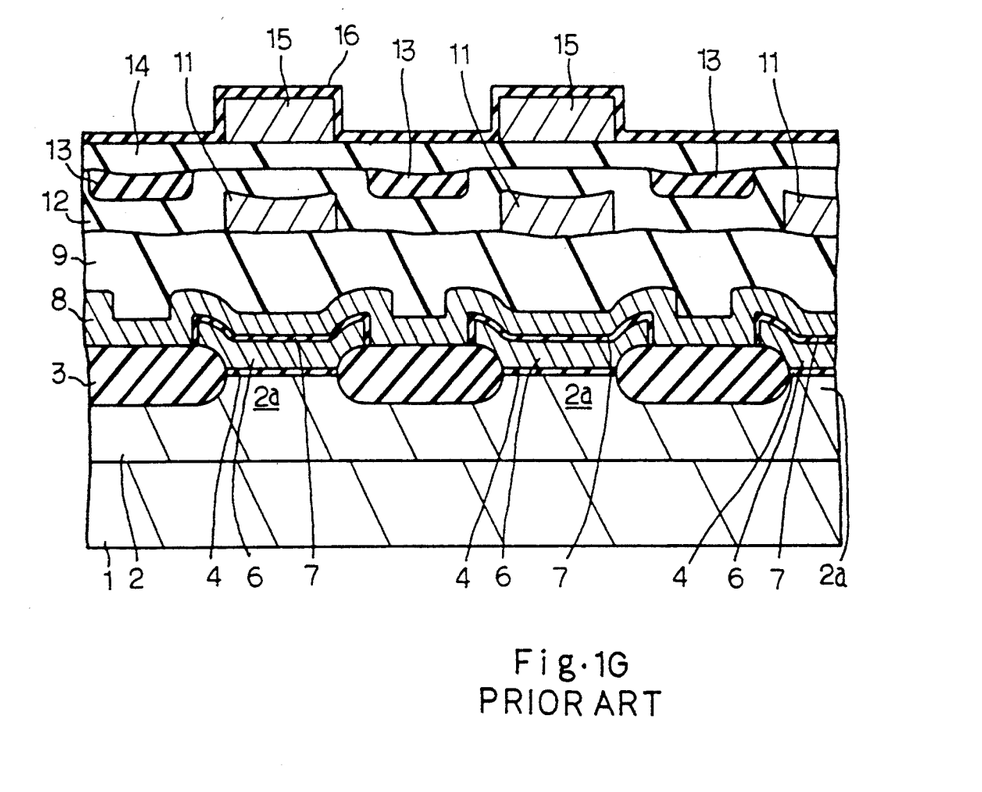

Silicon oxide is deposited over the smooth top surface through the plasma-assisted chemical vapor deposition process, and the plasma-deposited silicon oxide film 14 is formed on the smooth top surface. After formation of contact holes, appropriate metal is deposited on the plasma-deposited silicon oxide film 14, and is patterned into upper metal wirings 15 through a lithographic process followed by an etching. Finally, silicon nitride is deposited over the entire surface, and the silicon nitride film 16 covers the upper metal wirings 15 as shown in FIG. 1G.

The source and drain regions (not shown), the channel region 2a and the multiple gate structure form in combination a memory cell, and a data bit is stored in the floating gate electrode 6a in the form of electrons.

However, a problem is encountered in the prior art electrically programmable read only memory device in that a lot of the memory cells are liable to lose the data bits within several thousand hours, and the prior art electrically programmable read only memory device suffers from low reliability.

SUMMARY OF THE INVENTION

It is therefore an important object of the present invention to provide a non-volatile semiconductor memory device which keeps data bits in the form of accumulated electric charge for prolonged time period.

The present inventor had contemplated the problem inherent in the prior art non-volatile semiconductor memory device, and discovered that water contained in a spin-on-glass film or a polyimide film carried undesirable ion to the floating gate electrodes. The spin-on-glass film and the polyimide film were indispensable for creating a smooth surface, and could not be deleted from the non-volatile semiconductor memory device. The present inventor examined various insulating films, and found that a silicon oxynitride film was effective against the water contained in the spin-on-glass film or the polyimide film.

Therefore, the present invention proposes to insert a silicon oxynitride film between an accumulating layer for electric charge and a water-containing insulating film.

In accordance with the present invention, there is provided a non-volatile semiconductor memory device comprising: a) a plurality of memory cells each having an accumulating layer operative to accumulate electric charge for changing a conductance of a channel region between a source region and a drain region, b) a plurality of wirings for supplying at least electric signals to the plurality of memory cells, and d) a inter-level insulating film structure provided between the plurality of memory cells and the wirings, and having a water-containing insulating film for creating a smooth surface for predetermined wirings incorporated in the plurality of wirings, and a water resisting insulating film formed of a substance selected from the group consisting of nitrides and provided between the accumulating layer and the water-containing insulating film.

The substance may be silicon oxynitride or silicon nitride.

The non-volatile semiconductor memory device may be an electrically programmable read only memory device containing an electrically erasable and programmable read only memory device.

BRIEF DESCRIPTION OF THE DRAWINGS

The feature and advantages of the non-volatile semiconductor memory device according to the present invention will be more clearly understood from the following description taken in conjunction with the accompanying drawings in which.

DESCRIPTION OF THE PREFERRED EMBODIMENTS

First Embodiment

Figure 2:
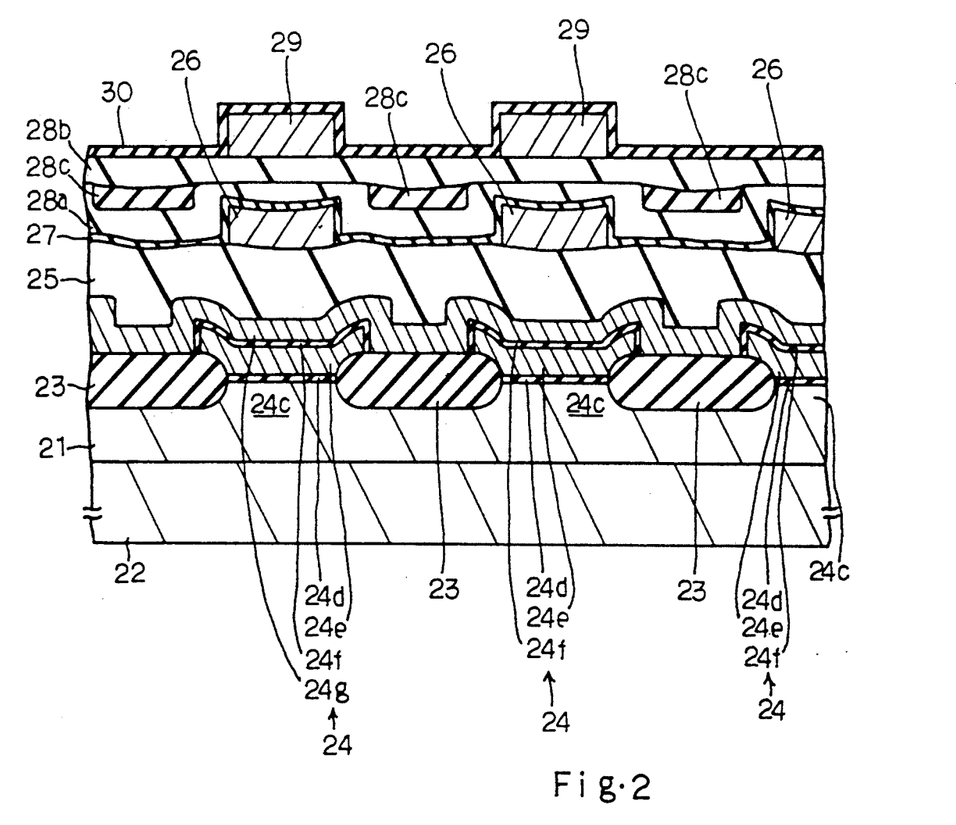
FIG. 2 is a cross sectional view showing the structure of an electrically programmable read only memory device according to the present invention.
Figure 3:
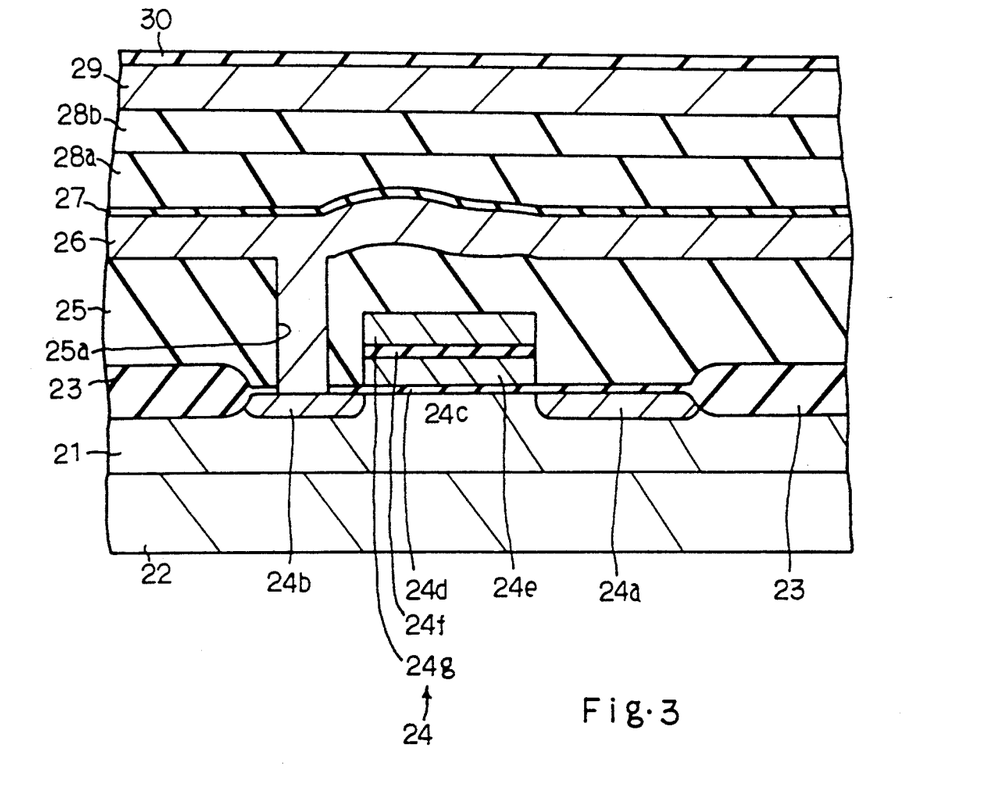
FIG. 3 is a cross sectional view showing the structure of the electrically programmable read only memory device at different angle.

Referring to FIGS. 2 and 3 of the drawings, an electrically programmable read only memory device embodying the present invention is fabricated on a p-type well 21 formed in a p-type silicon substrate 22, and a thick field oxide film 23 defines active areas for circuit components such as non-volatile memory cells in the p-type well 21. The non-volatile memory cells shown in FIG. 2 form a row. In each active area are formed an n-type source region 24a and an n-type drain region 24b which are spaced apart from each other by a channel region 24c. The channel region 24c is covered with a first gate insulating film 24d of silicon oxide, and a floating gate electrode 24e of polysilicon is provided on the first gate insulating film 24d. The floating gate electrode 24e is covered with a second gate insulating film 24f of silicon oxide, and a control gate electrode 24g is held in contact of the second gate insulating film 24f of each non-volatile memory cell. The floating gate electrode 24e is capacitively coupled with the channel region 24c, and the control gate electrode 24g is also capacitively coupled with the channel region 24c. For this reason, the conductance of the channel region 24c is affected by electric field extending from the control gate electrode 24g as well as electric field extending from the floating gate electrode 24e. The control gate electrode 24g is shared between the non-volatile memory cells of the row, and the source and drain regions 24a and 24b, the channel region 24c, the first and second gate insulating films 24d and 24f, the floating gate electrode 24e and the control gate electrode 24g as a whole constitute one of the non-volatile memory cells 24.

The non-volatile memory cells 24 are covered with a lower inter-level insulating film 25 of phosphosilicate glass, and contact holes 25a are formed in the lower inter-level insulating film 25 in such a manner as to expose the drain regions 24b of the non-volatile memory cells 24.

A plurality of bit lines 26 extend on the lower inter-level insulating film 25 at intervals, and are selectively held in contact with the drain regions 24b through the contact holes 25a.

A water resisting insulating film 27 of silicon oxynitride covers the bit lines 26 and the lower inter-level insulating film 25, and is as thin as 100 nanometers. The water resisting insulating film 27 prevents the floating gate electrodes 24e from water serving as a carrier for undesirable ionized impurity.

An upper inter-level insulating film sub-structure is implemented by a plasma-deposited silicon oxide films 28a and 28b and pieces of spin-on-glass 28c filling vacant spaces therebetween. The spin-on-glass creates a smooth surface together with the plasma-deposited silicon oxide film 28a. However, the spin-on-glass contains water, and the water carries ionized impurity toward the floating gate electrodes 24e. The lower inter-level insulating film 25 and the upper inter-level insulating film sub-structure form in combination a multiple level inter-level insulating film structure.

Metal wirings 29 extend over the upper inter-level insulating film sub-structure, and a passivation film 30 of silicon nitride covers the metal wirings 29 and the upper inter-level insulating film sub-structure.

While ultra-violet light is radiated onto the non-volatile memory cells 24, electrons are evacuated from the floating gate electrodes 24e, and the threshold level at the control gate electrode 24g is lowered.

In order to store data bits, the p-n junctions between the n-type drain regions 24b and the p-type well 21 are selectively and reversely biased, and the control gate electrode 24g is boosted over a power voltage level. Then, hot electrons are selectively injected into the floating gate electrodes 24e, and the threshold levels at the control gate electrode 24g become high due to the accumulated electrons. Thus, the data bits are stored in the non-volatile memory cells in the form of accumulated electron. If the ionized impurity reaches the floating gate electrodes 24e, the accumulated electron would be recombined with the ionized impurity. However, the water resisting insulating film 27 blocks the ionized impurity, and the floating gate electrodes 24e maintain the accumulated electrons for prolonged time period.

Figure 4:
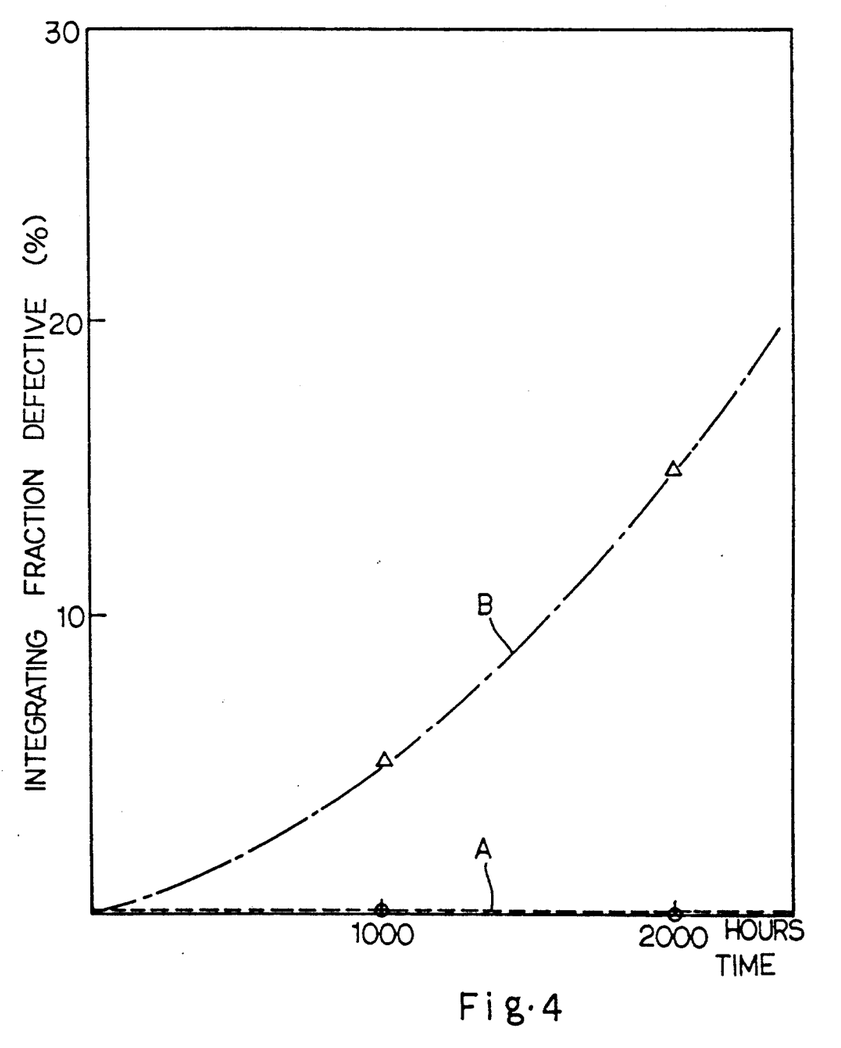
FIG. 4 is a graph showing integrating fraction defective in terms of time.

The present inventor confirmed the effect of the water resisting insulating film 27 of silicon oxynitride. After injection of hot electrons into the floating gate electrodes 24e, the integrating fraction defective were measured and plotted as indicated by Plots A. Only a negligible amount of defective non-volatile memory cells 24 took place after 2000 hours from the injection. On the other hand, Plots B is indicative of the integrating fraction defective of the prior art electrically programmable read only memory device shown in FIG. 1G, and defective memory cells took place around 15 per cent at 2000 hours. Thus, the water-resisting insulating film 27 is effective against the ionized impurity carried by the water.

Description is hereinbelow made on a process sequence for fabricating the electrically programmable read only memory device shown in FIGS. 2 and 3. The process sequence starts with preparation of the p-type silicon substrate 22, and the p-type well 21 is defined in the p-type silicon substrate 22 for changing the resistivity. Subsequently, the thick field oxide film 23 is selectively grown through a localized oxidation of silicon process, by way of example, and defines the active areas. Silicon oxide films are removed from the active areas, and the first gate insulating oxide films 24d are thermally grown on the fresh major surface.

Figure 5A:
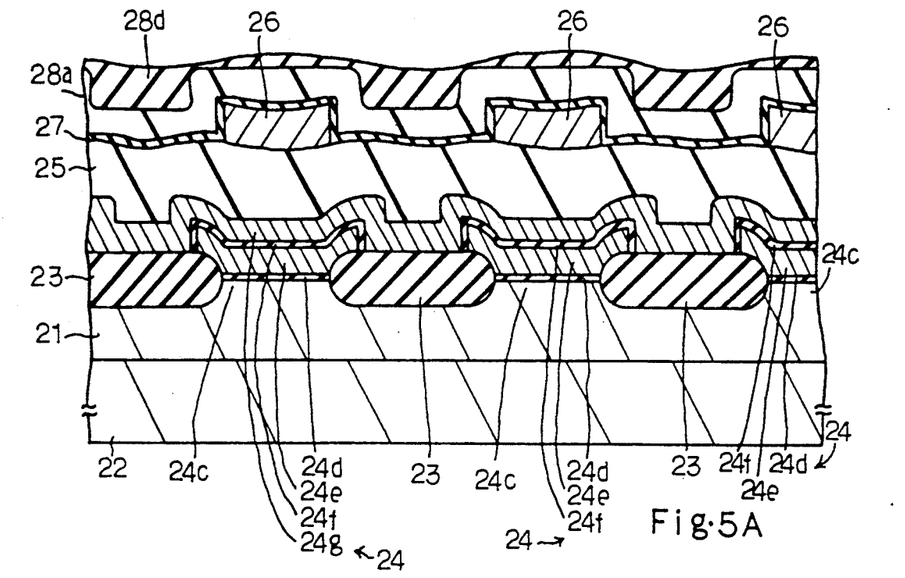
FIGS. 5A and 5B are cross sectional views showing a process sequence for fabricating the electrically programmable read only memory device according to the present invention.

A polysilicon film is deposited over the entire surface of the structure, and photoresist solution is spread on the polysilicon film. The photoresist film is exposed to light through an appropriate mask, and is developed into a photoresist mask. Using the photoresist mask, the polysilicon film is partially etched away, and polysilicon strips are left on the first gate oxide films 24d, respectively. The polysilicon strips 6 are spaced apart from one another at intervals, and extend in the direction perpendicular to the paper where FIG. 5A is illustrated.

The photoresist mask is stripped off, and the polysilicon strips are subjected to a thermal oxidation. Then, silicon oxide is grown on the polysilicon strips, and silicon oxide films cover the polysilicon strips, respectively. Polysilicon is deposited over the entire surface of the structure again, and the silicon oxide films and the exposed field oxide film are covered with a polysilicon film.

Though not shown in the drawings, an appropriate photoresist mask is produced from a photoresist film through a lithographic process, and defines the configuration of control gate electrodes. Using the appropriate photoresist mask, the polysilicon film, the silicon oxide films and the polysilicon strips are sequentially etched away, and the floating gate electrodes 24e, the second gate oxide films 24f and the control gate electrode 24g are patterned in a self-aligned manner.

Using the multiple gate structures as a mask, donor impurity is ion implanted into the p-type well 21, and the source and drain regions 24a and 24b are formed in the p-type well 22 on both sides of the channel region 24c.

Phosphosilicate glass is deposited over the entire surface of the structure, and the lower inter-level insulating film 25 covers the non-volatile memory cells 24 and the exposed field oxide film 23. On the lower inter-level insulating film 25 is deposited appropriate metal which are held in contact through the contact holes 25a with the drain regions 24b. An appropriate photoresist mask is patterned from a photoresist film through the lithographic process, and the metal film is partially etched away for forming bit lines 26.

The photoresist mask is stripped off, and silicon oxynitride is deposited to 100 nanometers over the entire surface by using a plasma-assisted chemical vapor deposition process. The plasma-assisted chemical vapor deposition is carried out in gaseous mixture of $SiH_4$, $NH_3$, $N_2O$ and $N_2$ at 300 degrees in centigrade, and the water-resisting insulating film 27 of silicon oxynitride topographically covers the bit lines 26. The silicon oxynitride film may range from 100 nanometers to 300 nanometers.

Silicon oxide is deposited over the water-resisting insulating film 27 by using a plasma-deposited chemical vapor deposition process, and the plasma-deposited silicon oxide film 28a topographically covers the water-resisting insulating film 27.

Alcohol solution containing silicon oxide is spun onto the plasma-deposited silicon oxide film 28a, and a spin-on-glass film 28d covers the plasma-deposited silicon oxide film 28a. The top surface of the spin-on-glass film 28d is relatively smooth rather than the plasma-deposited silicon oxide film 28a as shown in FIG. 5A.

Figure 5B:
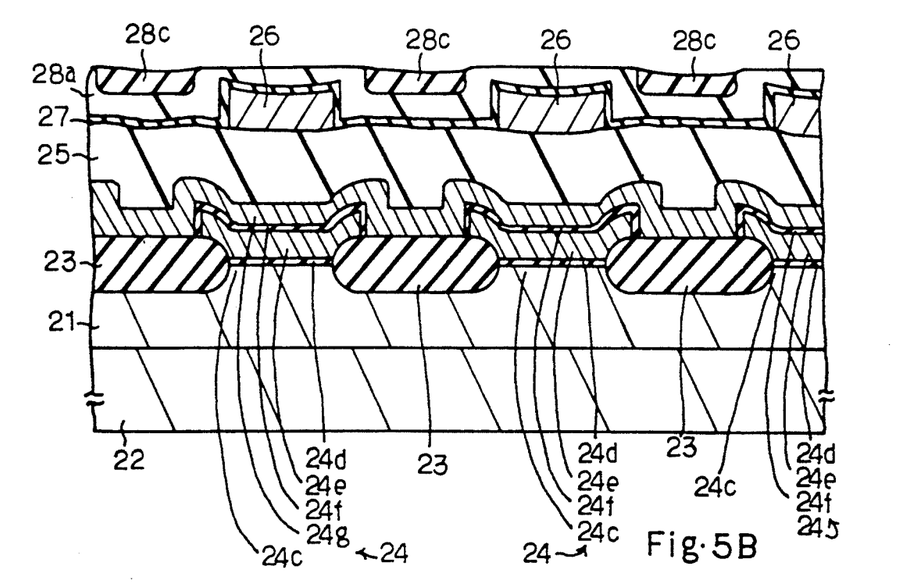

The spin-on-glass film 28d and the plasma-deposited silicon oxide film 28a are uniformly etched without any mask, and the pieces of spin-on-glass 28c is left in the valleys in the plasma-deposited silicon oxide film 28a. Thus, a smooth top surface is created through the etch-back process as shown in FIG. 5B.

Silicon oxide is deposited over the smooth top surface through the plasma-assisted chemical vapor deposition process, and the plasma-deposited silicon oxide film 28b is formed on the smooth top surface. After formation of contact holes, appropriate metal is deposited on the plasma-deposited silicon oxide film 28b, and is patterned into the metal wirings 29 through a lithographic process followed by an etching. Finally, silicon nitride is deposited over the entire surface, and the silicon nitride film 30 covers the metal wirings 29 as shown in FIG. 2. The silicon nitride film 30 prevents the non-volatile memory cells 24 from water and impurity.

As will be understood from the foregoing description, the water-resisting insulating film 27 prevents the non-volatile memory cells 24 from ionized impurity carried by the water diffused from the pieces of spin-on-glass 28c, and improves the reliability of the non-volatile memory cells 24.

Second Embodiment

Figure 6:
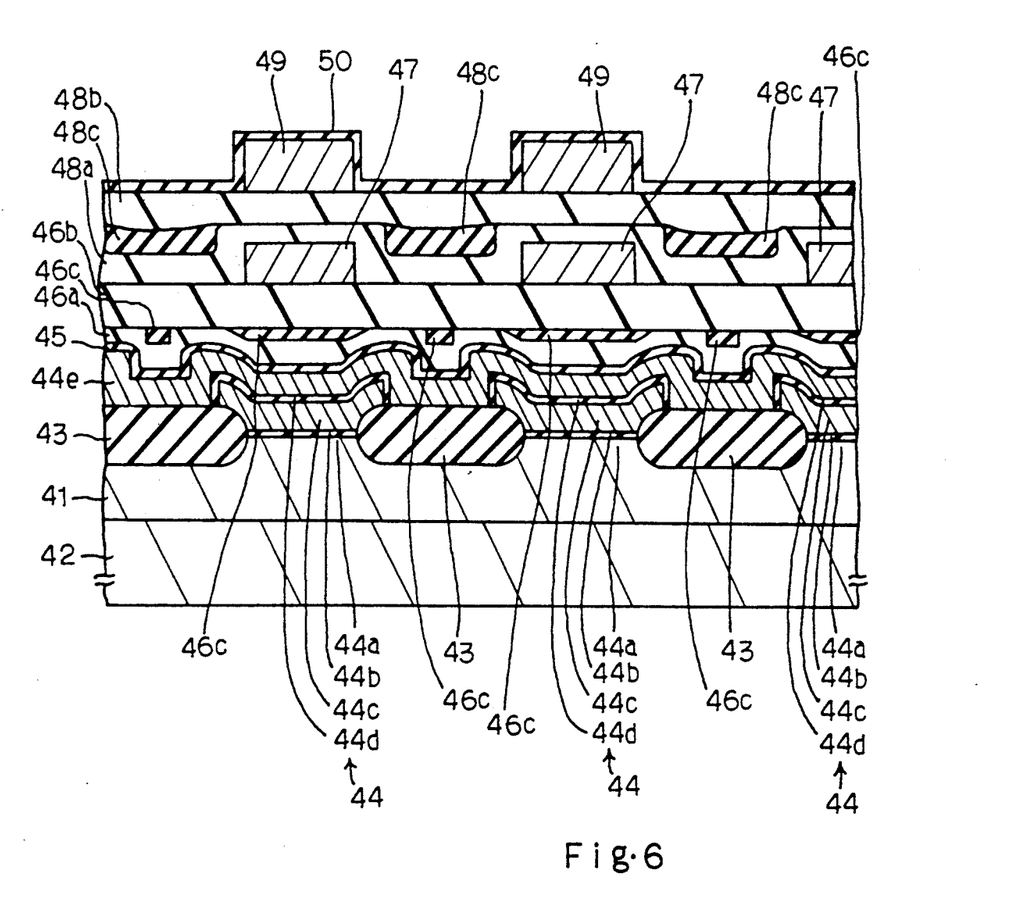
FIG. 6 is a cross sectional view showing the structure of another electrically programmable read only memory device according to the present invention.

Turning to FIG. 6 of the drawings, another electrically programmable read only memory device embodying the present invention is fabricated on a p-type well 41 formed in a p-type silicon substrate 42, and a thick field oxide film 43 defines active areas for circuit components such as non-volatile memory cells in the p-type well 41. The non-volatile memory cells shown in FIG. 6 also form a row of a memory cell array.

In each active area are formed an n-type source region and an n-type drain region which are spaced apart from each other by a channel region 44a. The channel region 44a is covered with a first gate insulating film 44b of silicon oxide, and a floating gate electrode 44c of polysilicon is provided on the first gate insulating film 44b. The floating gate electrode 44c is covered with a second gate insulating film 44d of silicon oxide, and a control gate electrode 44e is held in contact of the second gate insulating film 44d of each non-volatile memory cell. The floating gate electrode 44c is capacitively coupled with the channel region 44a, and the control gate electrode 44e is also capacitively coupled with the channel region 44a. For this reason, the conductance of the channel region 44a is affected by electric field extending from the control gate electrode 44e as well as electric field extending from the floating gate electrode 44c. The control gate electrode 44e is shared between the non-volatile memory cells of the row, and the source and drain regions, the channel region 44a, the first and second gate insulating films 44b and 44d, the floating gate electrode 44c and the control gate electrode 44e as a whole constitute one of the non-volatile memory cells 44.

The control gate electrode, the exposed thick field oxide film 43 and the exposed first gate insulating films 44b are covered with a water-resisting insulating film 45 of silicon oxynitride, and the water-resisting insulating film 45 prevents the floating gate electrodes 44c from ionized impurity carried by water.

A lower inter-level insulating film sub-structure covers the water-resisting insulating film 45, and is implemented by plasma-deposited silicon oxide films 46a and 46b and pieces of spin-on-glass 46c filling vacant spaces therebetween. By virtue of the pieces of spin-on-glass 46c, the plasma-deposited silicon oxide film 46b creates a smooth surface.

A plurality of bit lines 47 extend on the lower inter-level insulating film substructure at intervals, and are selectively held in contact with the drain regions through the contact holes. The bit lines 47 are free from undesirable disconnection, because the lower inter-level insulating film sub-structure provides the smooth surface for the bit lines 47.

An upper inter-level insulating film sub-structure is implemented by a plasma-deposited silicon oxide films 48a and 48b and pieces of spin-on-glass 48c filling vacant spaces therebetween. The spin-on-glass creates a smooth surface together with the plasma-deposited silicon oxide film 48a. The lower inter-level insulating film sub-structure 46a/ 46b/ 46c and the upper inter-level insulating film sub-structure 48a/ 48b/ 48c form in combination a multiple level inter-level insulating film structure.

Metal wirings 49 extend over the upper inter-level insulating film sub-structure, and a passivation film 40 of silicon nitride covers the metal wirings 49 and the upper inter-level insulating film sub-structure.

In this instance, the water-resisting insulating film 45 is inserted between the non-volatile memory cells 44 and the pieces of spin-on-glass 46c and 48c, and the floating gate electrodes 44c maintain accumulated electrons for prolonged time period. As a result, the water-resisting insulating film 45 improves the reliability of the non-volatile memory cells 44.

Third Embodiment

Figure 7:
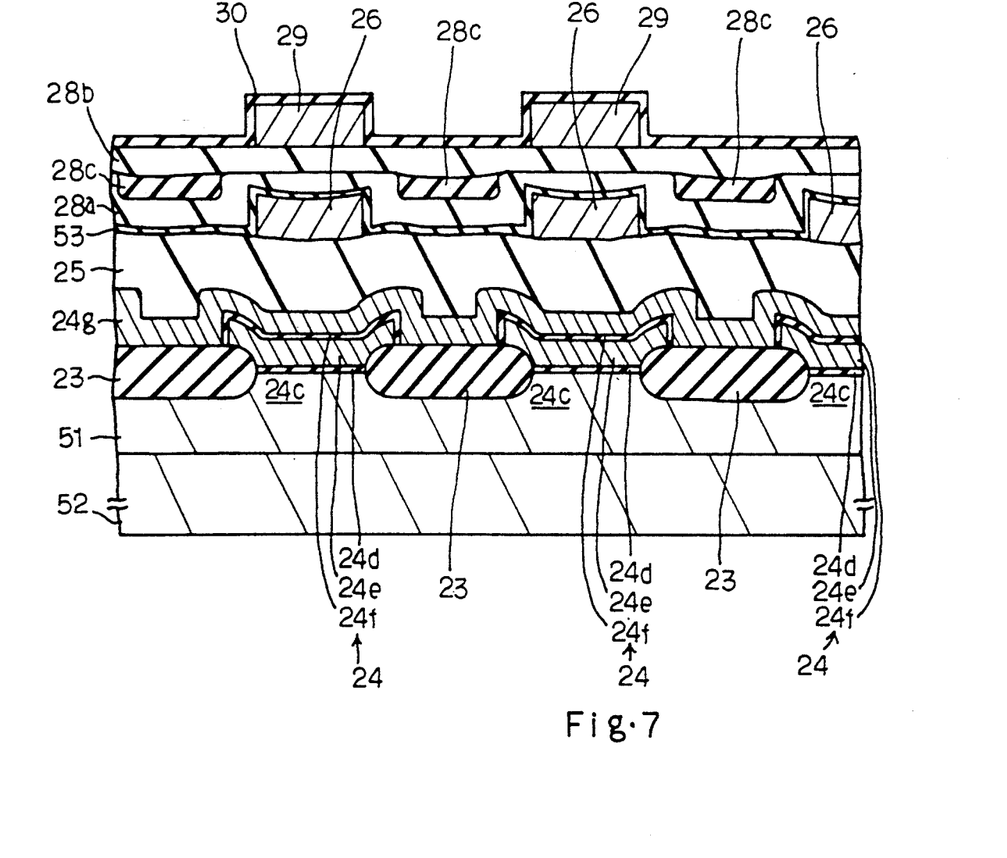
FIG. 7 is a cross sectional view showing the structure of yet another electrically programmable read only memory device according to the present invention.

Turning to FIG. 7 of the drawings, yet another electrically programmable read only memory device embodying the present invention is fabricated on a p-type well 51 formed in a p-type silicon substrate 52. The electrically programmable read only memory device implementing the third embodiment is similar to the first embodiment except for a water-resisting insulating film 53 formed of silicon nitride. The other films, electrodes and regions are labeled with the same references designating corresponding parts of the first embodiment without any detailed description for the sake of simplicity.

The silicon nitride can block ionized impurity carried by water, and the floating gate electrodes 24e maintain accumulated electrons for prolonged time period.

Although particular embodiments of the present invention have been shown and described, it will be obvious to those skilled in the art that various changes and modifications may be made without departing from the spirit and scope of the present invention. The present invention is applicable to any non-volatile memory device for storing data bits in the form of accumulated electric charge, and a non-volatile memory device having an accumulating interface between two thin films different in conductivity. The non-volatile semiconductor memory devices described hereinbefore are of the type electrically programmable and erasable with ultra-violet radiation. However, the non-volatile semiconductor memory device may be of an electrically erasable and programmable type or of a flush-write electrically erasable and programmable type. Moreover, the water-resisting insulating film is expected to block ionized impurity carried by water, and any dense layers such as other nitride films achieve the same advantage as the silicon oxynitride film and the silicon nitride film. Finally, polyimide is used for creating a smooth surface instead of the spin-on-glass, and the polyimide also contains water. Therefore, the water resisting insulating film according to the present invention is effective against the water contained in the polyimide, and the spin-on-glass films are replaceable with polyimide films in the above described embodiments.

What is claimed is:

1. A non-volatile semiconductor memory device comprising:
   a) a plurality of memory cells each having an accumulating layer operative to accumulate electric charge for changing a conductance of a channel region between a source region and a drain region,
   b) a plurality of wirings for supplying at least electric signals to said plurality of memory cells, and
   d) a inter-level insulating film structure provided between said plurality of memory cells and said wirings, and having a water-containing insulating film for creating a smooth surface for predetermined wirings incorporated in said plurality of wirings, and a water resisting insulating film formed of a substance selected from the group consisting of nitrides and provided between said accumulating layer and said water-containing insulating film.

2. A non-volatile semiconductor memory device, fabricated on a semiconductor substrate, comprising:
a) a plurality of non-volatile memory cells for storing data bits, respectively, each of said plurality of non-volatile memory cells having
   a-1) source and drain regions formed in a surface portion of said semiconductor substrate and spaced apart from each other by a channel region,
   a-2) a first gate insulating film covering said channel region,
   a-3) a floating gate electrode held in contact with said first gate insulating film and capacitively coupled with said channel region, one of said data bits being stored in said floating gate electrode in the form of electric charge,
   a-4) a second gate insulating film covering said floating gate electrode, and
   a-5) a control gate electrode held in contact with said second gate insulating film and capacitively coupled with said channel region;
b) a multiple level insulating film structure having
   b-1) a water-containing film formed through a coating with a solution followed by a baking, and creating a smooth surface, and
   b-2) a water resisting insulating film formed of a substance selected from the group consisting of silicon oxynitride and silicon nitride, and provided between said water-containing film and said floating gate electrode; and
c) wirings including first wirings extending over said smooth surface.

3. A non-volatile semiconductor memory device as set forth in claim 2, in which said plurality of non-volatile memory cells are of a type electrically programmable and erasable with light, a type electrically erasable and programmable or a type flush-write electrically erasable and programmable.

4. A non-volatile semiconductor memory device as set forth in claim 3, in which said multiple level insulating film structure comprises a lower inter-level insulating film sub-structure having said water resisting insulating film covering said plurality of non-volatile memory cells, a lower insulating film topographically covering said water resisting insulating film and said water-containing film forming said smooth surface together with said lower insulating film, and an upper inter-level insulating film sub-structure covering said first wirings.

5. A non-volatile semiconductor memory device as set forth in claim 4, in which said lower insulating film and said water-containing film are formed of plasma-deposited silicon oxide and spin-on-glass, respectively.

6. A non-volatile semiconductor memory device as set forth in claim 3, in which said multiple level insulating film structure comprises a lower inter-level insulating film sub-structure covering said plurality of non-volatile memory cells, and an upper inter-level insulating film sub-structure having said water resisting insulating film covering second wirings extending on said lower inter-level insulating sub-structure, an upper insulating film topographically covering said water resisting insulating film and said water-containing film forming said smooth surface together with said upper insulating film, said first wirings extending on said smooth surface of said upper inter-level insulating film.

7. A non-volatile semiconductor memory device as set forth in claim 6, in which said upper insulating film and said water-containing film are formed of plasma-deposited silicon oxide and spin-on-glass, respectively.

* * * * *